US009385649B2

(12) United States Patent
Wang et al.

(10) Patent No.: US 9,385,649 B2
(45) Date of Patent: Jul. 5, 2016

(54) RC OSCILLATOR BASED ON DELAY-FREE COMPARATOR

(71) Applicant: QUALCOMM INCORPORATED, San Diego, CA (US)

(72) Inventors: Le Wang, San Diego, CA (US); Arash Mehrabi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/290,665

(22) Filed: May 29, 2014

(65) Prior Publication Data

US 2015/0349710 A1    Dec. 3, 2015

(51) Int. Cl.
| H03K 3/26 | (2006.01) |
| H03B 5/04 | (2006.01) |
| H03B 5/20 | (2006.01) |
| H04B 5/04 | (2006.01) |
| H03K 3/30 | (2006.01) |
| H03K 3/0231 | (2006.01) |
| H03K 4/50 | (2006.01) |

(52) U.S. Cl.
CPC .. *H03B 5/04* (2013.01); *H03B 5/20* (2013.01); *H03K 3/0231* (2013.01); *H03K 3/30* (2013.01); *H03K 4/50* (2013.01); *H04B 5/04* (2013.01)

(58) Field of Classification Search
CPC ......... H03K 3/30; H03K 3/00; H03K 3/0231; H03K 4/50; H03B 5/04; H03B 5/20
USPC .................. 331/111, 143, 175, 176
See application file for complete search history.

(56) References Cited

U.S. PATENT DOCUMENTS

| 6,356,161 | B1* | 3/2002 | Nolan et al. ......... 331/176 |
| 8,044,740 | B2 | 10/2011 | Zhu |
| 8,054,141 | B2 | 11/2011 | Saw |
| 8,659,362 | B2 | 2/2014 | Bhowmik et al. |
| 2005/0237118 | A1 | 10/2005 | Mader et al. |
| 2012/0182080 | A1 | 7/2012 | Sinitsky et al. |
| 2012/0194279 | A1 | 8/2012 | Nonis et al. |
| 2013/0200924 | A1 | 8/2013 | Hsiao |

FOREIGN PATENT DOCUMENTS

WO    2004107576 A1    12/2004

OTHER PUBLICATIONS

Atmel, "AVR051: Set-up and Use the External RC Oscillator," Rev. 2507-AVR-02/02, 2002, < URL : http://www.eetasia.com/AR-TICLES/2003APR/A/2003APR04_AMD_EMS_MPR_AN.PDF?SOURCES=DOWNLOAD >, 5 pages.
International Search Report and Written Opinion—PCT/US2015/029759—ISA/EPO—Oct. 22, 2015.
Paidimarri A., et al., "A 120nW 18.5kHz RC oscillator with comparator offset cancellation for ±0.25% temperature stability", IEEE International Solid-State Circuits Conference Digest of Technical Papers (ISSCC), Feb. 2013, pp. 184-185.

* cited by examiner

*Primary Examiner* — Arnold Kinkead
(74) *Attorney, Agent, or Firm* — Procopio, Cory, Hargreaves & Savitch, LLP

(57) ABSTRACT

Cancelling a delay in a comparator of an RC oscillator configured to generate a clock pulse, including: selectively coupling a plurality of current sources to a first capacitor, a second capacitor, and a resistor, wherein the plurality of current source charge and discharge the first capacitor and the second capacitor, and charge the resistor; charging the first capacitor at a higher rate during a first phase of the clock pulse than a second phase of the clock pulse, and charging the second capacitor at a higher rate during a third phase of the clock pulse than a fourth phase of the clock pulse; and generating the clock pulse by enabling the comparator to compare a voltage on the first or second capacitor with a voltage on the resistor.

20 Claims, 9 Drawing Sheets

RC OSCILLATOR BASED ON DELAY-FREE COMPARATOR

BACKGROUND

1. Field

This invention relates to oscillators, and more specifically, to an RC oscillator based on a delay-free comparator.

2. Background

The resistive-capacitive (RC) oscillator is an important block in very-large-scale integration (VLSI) systems. It provides a reference clock when a crystal oscillator is not available or off for power saving purpose. However, the frequency accuracy of the RC oscillator is limited by RC process variation, resistor temperature coefficient, and comparator delay variation.

The temperature variation of the comparator delay is the major contributor of the frequency variation. Conventionally, the bias current of the comparator is boosted up to make the total delay a small fraction of the clock period. However, the comparator delay saturates at high bias current. To counter this effect, the device size is increased. However, this results in even more current requirement. Therefore, the power efficiency of the RC oscillator prevents it from use in low power applications. Other solutions include selecting low frequency for sleep-mode clock to bypass the delay issue or applying a closed-loop integrator to force the comparator trip voltage to be equal to the reference.

SUMMARY

The present invention provides for extracting and cancelling a comparator delay which causes frequency variation in a clock pulse of an RC oscillator, using a switched-capacitor technique.

In one embodiment, a method for cancelling a delay in a comparator of an RC oscillator configured to generate a clock pulse is disclosed. The method includes: selectively coupling a plurality of current sources to a first capacitor, a second capacitor, and a resistor, wherein the plurality of current source charge and discharge the first capacitor and the second capacitor, and charge the resistor; charging the first capacitor at a higher rate during a first phase of the clock pulse than a second phase of the clock pulse, and charging the second capacitor at a higher rate during a third phase of the clock pulse than a fourth phase of the clock pulse; and generating the clock pulse by enabling the comparator to compare a voltage on the first or second capacitor with a voltage on the resistor.

In another embodiment, an RC oscillator which generates a clock pulse is disclosed. The RC oscillator includes: a comparator delay cancellation circuit comprising: a resistor and a pair of capacitors including a first capacitor and a second capacitor; a plurality of current sources configured to charge and discharge the pair of capacitors and the resistor, wherein the first capacitor is charged during first and second phases of the clock pulse and is discharged during third and fourth phases of the clock pulse, and the second capacitor is charged during the third and fourth phases of the clock pulse and is discharged during the first and second phases of the clock pulse, wherein the first capacitor is charged at a same rate during the first phase as the second phase, and the second capacitor is charged at a higher rate during the third phase than the fourth phase; a plurality of switches configured to selectively couple the plurality of current sources to the pair of capacitors and the resistor; and a comparator having a first input and a second input, the comparator configured to generate the clock pulse by comparing a voltage on the first or second capacitor with a voltage on the resistor.

In yet another embodiment, an apparatus to generate a clock pulse is disclosed. The apparatus includes: means for comparing two voltages having a first input and a second input; means for canceling delay in the means for comparing two voltages comprising: means for charging and discharging a first capacitor and a second capacitor, wherein the means for charging and discharging charges the first capacitor at a higher rate during a first phase of the clock than a second phase of the clock pulse, and charges the second capacitor at a higher rate during a third phase of the clock pulse than a fourth phase of the clock pulse; means for selectively coupling the means for charging and discharging to the pair of capacitors and a resistor, wherein the means for comparing two voltages generates the clock pulse by comparing a voltage on the first or second capacitor with a voltage on the resistor.

Other features and advantages of the present invention should be apparent from the present description which illustrates, by way of example, aspects of the invention.

BRIEF DESCRIPTION OF THE DRAWINGS

The details of the present invention, both as to its structure and operation, may be gleaned in part by study of the appended further drawings, in which like reference numerals refer to like parts, and in which.

DETAILED DESCRIPTION

As stated above, the RC oscillator is an important block in VLSI systems. It provides a reference clock when a crystal oscillator is not available or off for power saving purpose. However, the frequency accuracy of the RC oscillator is limited by RC process variation, resistor temperature coefficient, and comparator delay variation. In a conventional RC oscillator design, the offset voltage of the comparator is canceled by comparing two capacitor voltages with a resistor voltage. When the voltage on the first capacitor is ramped up as it is being charged by the first charging current, the second capacitor is shorted to the ground. The comparator compares the first capacitor voltage to the resistor voltage. Upon transition of the comparator, the first capacitor is shorted to the ground, while the voltage on the second capacitor is ramped up as it is being charged by the second charging current. The comparator now compares the second capacitor voltage to the resistor voltage with connections of the capacitor voltage and the resistor voltage to the comparator inputs swapped. The voltage offsets of the comparator are equal in value but opposite in sign during the two phases of the clock cycle (i.e., $T_1$ and $T_2$), and thus, they cancel out. Equation (1) shows the duration of the first phase of the clock cycle as RC minus the product of C and the offset voltage $V_{OS}$ divided by the current I, plus the time delay ($T_d$). Equation (2) shows the duration of the second phase of the clock cycle as RC plus the product of C and the offset voltage $V_{OS}$ divided by the current I, plus $T_d$. Equation (3) shows the derivation of the clock period (T) of the RC oscillator as the sum of the durations of the first phase and the second phase. Thus, the clock period is shown as being equal to two times the RC time constant plus rise and fall time delays ($2*T_d$) of the comparator. Therefore, equation (3) shows the cancellation of the comparator offset voltage ($V_{OS}$), but the time delays of the comparator remain.

$$T_1 = RC - CV_{OS}/I + T_d \qquad (1)$$

$$T_2 = RC + CV_{OS}/I + T_d \qquad (2)$$

$$T = T_1 + T_2 = 2*RC + 2*T_d \qquad (3)$$

Certain embodiments as described herein provide for extracting and cancelling the comparator delay which causes frequency variation in a clock pulse of an RC oscillator, using a switched-capacitor technique. After reading this description it will become apparent how to implement the invention in various implementations and applications. Although various implementations of the present invention will be described herein, it is understood that these implementations are presented by way of example only, and not limitation. As such, this detailed description of various implementations should not be construed to limit the scope or breadth of the present invention.

Figure 1:
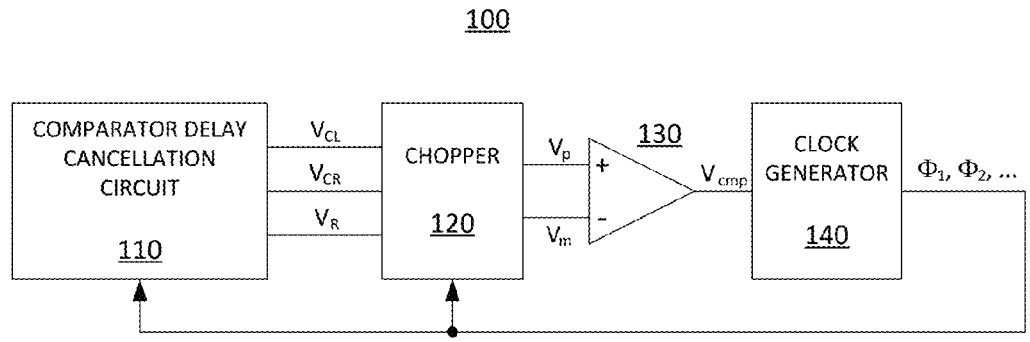
FIG. 1 is a function block diagram of an RC oscillator circuit including a delay-cancellation circuit, a chopper, a comparator, and a clock generator, implemented in accordance with one embodiment of the present invention.

FIG. 1 is a function block diagram of an RC oscillator circuit 100 including a delay-cancellation circuit 110, a chopper 120, a comparator 130, and a clock generator 140, implemented in accordance with one embodiment of the present invention. The combination of the delay-cancellation circuit 110 and the chopper 120 extracts and cancels the comparator delay in a clock pulse using a switched-capacitor technique (see FIG. 2). The duration of the clock pulse is equal to the summation of the clock turn-on and turn-off times of the comparator and the feedback loop. During clock phases $\Phi_1$ and $\Phi_3$ of the clock pulse, the active capacitor is ramped down with the same amount of discharging current, and the inactive capacitor starts ramping up at a rate that is 50% higher than a nominal rate, and the inactive capacitor becomes active and is then ramped up at the nominal rate during $\Phi_2$ and $\Phi_4$. Accordingly, the clock pulse meets the trip point of the comparator (i.e., $V_{CL}=V_R$ or $V_{CR}=V_R$) earlier so that at the instant of transition, the total delay is equal to that of a delay-free comparator with a nominal ramp-up rate.

Figure 2:
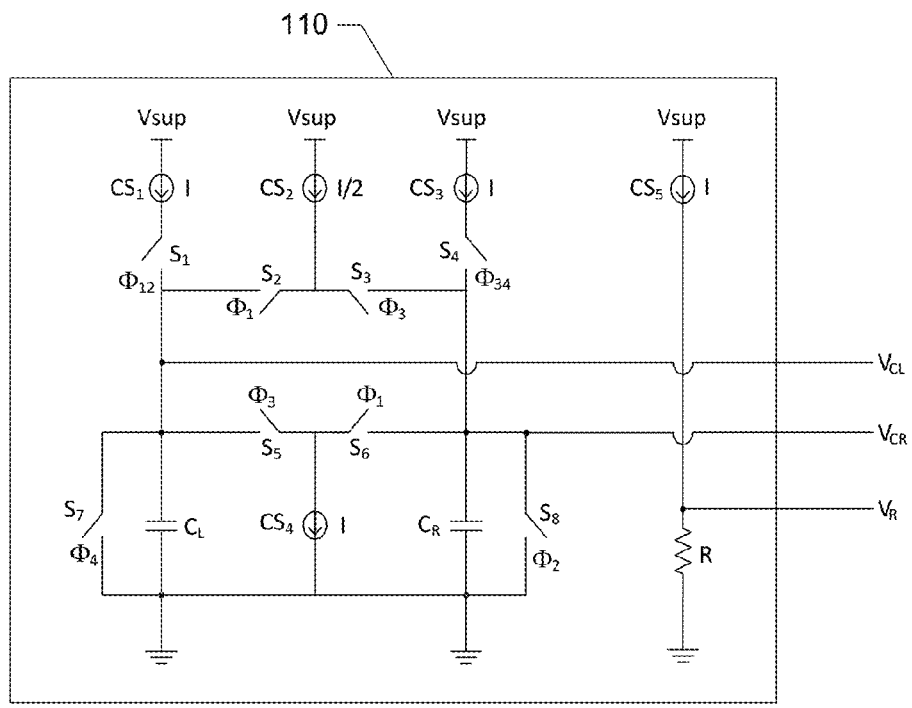
FIG. 2 is a detailed schematic diagram of the delay-cancellation circuit in accordance with one embodiment of the present invention.

FIG. 2 is a detailed schematic diagram of the delay-cancellation circuit 110 in accordance with one embodiment of the present invention. In the illustrated embodiment of FIG. 2, the delay-cancellation circuit 110 includes capacitors $C_L$ and $C_R$, resistor R, current sources $CS_1$ through $CS_5$, and switches $S_1$ through $S_8$. Current sources $CS_1$, $CS_3$, $CS_4$, and $CS_5$ supply current I, when connected, while current source $CS_2$ supply current 0.5*I, when connected. Further, current sources $CS_1$, $CS_2$, $CS_3$, and $CS_5$ are coupled to the supply voltage for charging the capacitors, while $CS_4$ is coupled to the ground voltage for discharging the capacitors. The delay-cancellation circuit 110 also includes three output nodes, $V_{CL}$ (left capacitor voltage), $V_{CR}$ (right capacitor voltage), and $V_R$ (resistor voltage).

During the first clock phase ($\Phi_1$), switches $S_1$, $S_2$, and $S_6$ are closed so that capacitor $C_L$ is charged with current from current sources $CS_1$ and $CS_2$, while capacitor $C_R$ is discharged by current sink $CS_4$. Moreover, capacitor $C_L$ is charged at 50% higher rate than a nominal rate because current source $CS_1$ supplies current I (nominal rate), while current source $CS_2$ supplies additional current 0.5*I (50% more) to capacitor $C_L$. During the second clock phase ($\Phi_2$), switches $S_1$ and $S_8$ are closed so that capacitor $C_L$ is charged with current from current source $CS_1$, while capacitor $C_R$ is shorted to the ground. During the third clock phase ($\Phi_3$), switches $S_3$, $S_4$, and $S_5$ are closed so that capacitor $C_R$ is charged with current from current sources $CS_2$ and $CS_3$, while capacitor $C_L$ is discharged by current sink $CS_4$. Moreover, capacitor $C_R$ is charged at 50% higher rate than the nominal rate because current source $CS_3$ supplies current I (nominal rate), while current source $CS_2$ supplies additional current 0.5*I (50% more) to capacitor $C_R$. During the fourth clock phase ($\Phi_4$), switches $S_4$ and $S_7$ are closed so that capacitor $C_R$ is charged with current from current source $CS_3$, while capacitor $C_L$ is shorted to the ground. Current source $CS_5$ supplies current I to resistor R so that the resistor voltage $V_R$ will have a constant value IR. The clock pulse repeats the four phases as described above.

Figure 3:
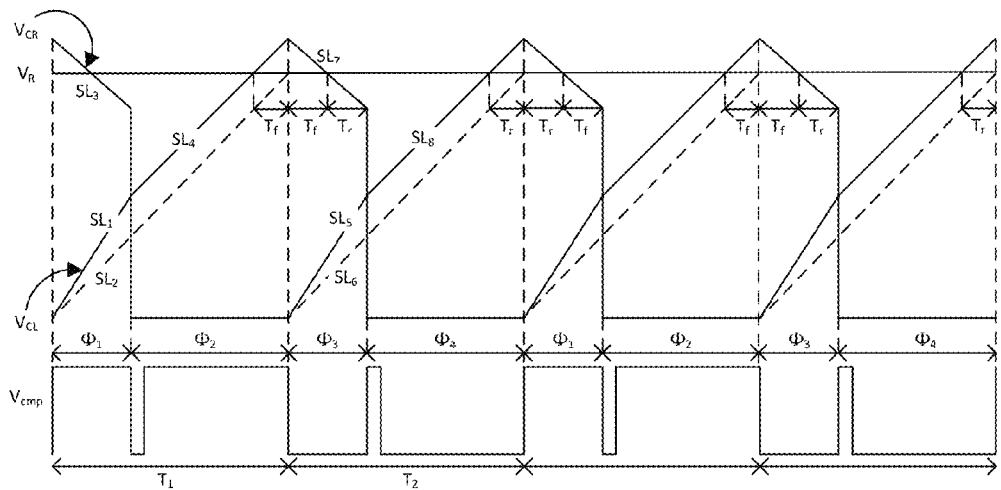
FIG. 3 is a diagram showing timing and voltage waveforms of the RC oscillator.

FIG. 3 is a diagram showing timing and voltage waveforms of the RC oscillator 100 (as shown in FIG. 1) with delay cancellation circuit 110 (as shown in FIG. 2). As described above with respect to FIG. 2, during the first clock phase ($\Phi_1$), capacitor $C_L$ is charged at 50% higher rate than a nominal rate by current sources $CS_1$ and $CS_2$, while capacitor $C_R$ is discharged by current sink $CS_4$. Correspondingly, during the first clock phase ($\Phi_1$) shown in FIG. 3, $V_{CL}$ ramps up at a slope (solid line $SL_1$) that is 50% higher than the nominal rate (dotted line slope $SL_2$). Moreover, $V_{CR}$ ramps down (capacitor $C_R$ discharging) at the nominal rate (solid line slope $SL_3$). During the second clock phase ($\Phi_2$) shown in FIG. 2, capacitor $C_L$ is charged at the nominal rate by the current source $CS_1$, while capacitor $C_R$ is shorted to the ground. Correspondingly, during the second clock phase ($\Phi_2$) shown in FIG. 3, $V_{CL}$ ramps up at the nominal rate (solid line slope $SL_4=SL_2$). Moreover, $V_{CR}$ is tied to the ground voltage. Further, during the second clock phase ($\Phi_2$), when the capacitor voltage (i.e., $V_{CL}$) reaches the trip point of the comparator (when $V_{CL}=V_R$), the comparator's output transitions after some delay ($T_d$). During the third clock phase ($\Phi_3$) shown in FIG. 2, capacitor $C_R$ is charged at 50% higher rate than the nominal rate by current sources $CS_2$ and $CS_3$, while capacitor $C_L$ is discharged by current sink $CS_4$. Correspondingly, during the third clock phase ($\Phi_3$) shown in FIG. 3, $V_{CR}$ ramps up at a slope (solid line $SL_5$) that is 50% higher than the nominal rate (dotted line slope $SL_6$). Moreover, $V_{CL}$ ramps down (capacitor $C_L$ discharging) at the nominal rate (solid line slope $SL_7$). Thus, after the comparator's output transitions, the capacitor voltage ($V_{CL}$) stays connected to the comparator, but it is ramped down (solid line slope $SL_7$) with the same amount of discharging current. After some delay ($T_r$), it causes the comparator to make an opposite transition. The time duration between the two transitions is equal to the fall time delay ($T_f$) plus the rise time delay ($T_r$) of the comparator. During the fourth clock phase ($\Phi_4$) shown in FIG. 2, capacitor $C_R$ is charged by the current source $CS_3$, while capacitor $C_L$ is shorted to the ground. Correspondingly, during the fourth clock phase ($\Phi_4$) shown in FIG. 3, $V_{CR}$ ramps up at the nominal rate (solid line slope $SL_8=SL_6$). Moreover, $V_{CL}$ is tied to the ground voltage. Thus, the cancellation of the comparator delay from the clock period is shown in FIG. 3 by comparing the real comparator (solid lines) with an ideal delay-free comparator (dashed lines), wherein the real comparator with the delay transitions at the same time. Equations (4), (5), and (6) show the derivation of the clock period (T).

$$[I*T_1+I/2*(T_r+T_f)]/C=I*R-V_{OS}+I*T_f/C \quad (4)$$

$$[I*T_2+I/2*(T_f+T_r)]/C=I*R+V_{OS}+I*T_r/C \quad (5)$$

$$T=T_1+T_2=2*RC \quad (6)$$

Equation (4) shows the comparator voltage during the first time period ($T_1$) including the first phase ($\Phi_1$) and the second phase ($\Phi_2$) of the clock pulse. Equation (5) shows the comparator voltage during the second time period ($T_2$) including the third phase ($\Phi_3$) and the fourth phase ($\Phi_4$) of the clock pulse. The difference in the comparator voltage during these two time periods is the opposite polarity of the offset voltage and the time delay, which cancel out to produce resultant equation (6). Thus, equation (6) shows that the clock period depends solely on the time constant (RC).

Figure 4:
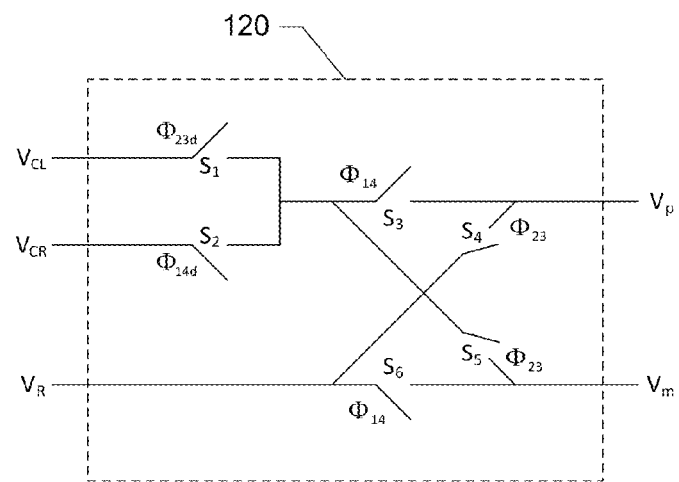
FIG. 4 is a detailed schematic diagram of the chopper in accordance with one embodiment of the present invention.

FIG. 4 is a detailed schematic diagram of the chopper 120 in accordance with one embodiment of the present invention. In the illustrated embodiment of FIG. 4, switches $S_1$ and $S_2$ select between $V_{CL}$ and $V_{CR}$, whereas switches $S_3$ through $S_6$ select between the capacitor voltage ($V_{CL}$ or $V_{CR}$) and the resistor voltage ($V_R$). Thus, the switches couple the capacitor voltage and the resistor voltage to the two comparator input nodes ($V_p$ and $V_m$). By closing switches $S_3$ and $S_6$, while keeping switches $S_4$ and $S_5$ open, the capacitor voltage ($V_{CL}$ or $V_{CR}$) couples to the plus comparator input node ($V_p$), while the resistor voltage ($V_R$) couples to the minus comparator input node ($V_m$). In contrast, by closing switches $S_4$ and $S_5$, while keeping switches $S_3$ and $S_6$ open, the resistor voltage ($V_R$) couples to the plus comparator input node ($V_p$), while the capacitor voltage ($V_{CL}$ or $V_{CR}$) couples to the minus comparator input node ($V_m$).

Figure 5:
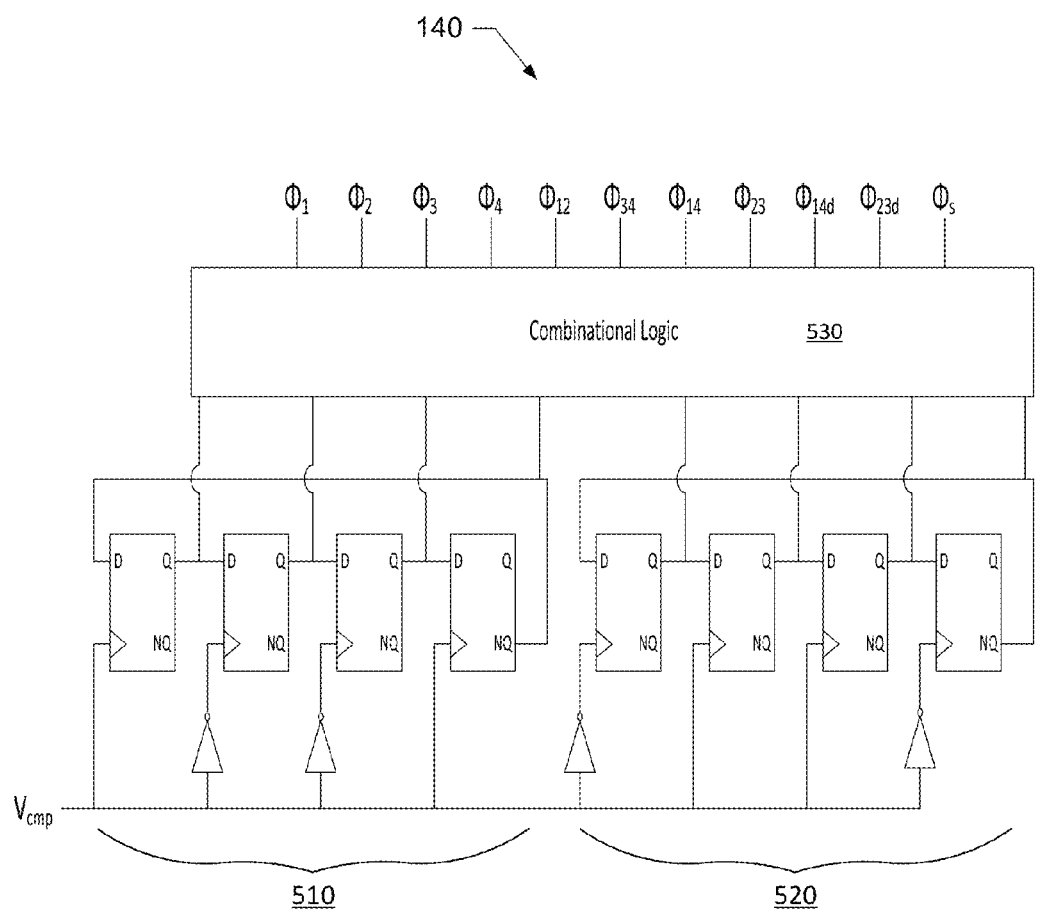
FIG. 5 is a functional block diagram of the clock generator in accordance with one embodiment of the present invention.

FIG. 5 is a functional block diagram of the clock generator 140 in accordance with one embodiment of the present invention. As shown, the clock generator 140 employs shift registers 510, 520 running in parallel to construct the different clock phases. The states (e.g., one-hot states) of the shift registers 510, 520 are combined through XOR and XNOR gates in the combinational logic 530. The comparator output ($V_{cmp}$) serves as a clock input for the shift registers 510, 520 and includes four phases ($\Phi_1$, $\Phi_2$, $\Phi_3$, and $\Phi_4$). The left shift register 510 generates the main control clocks ($\Phi_{12}$, $\Phi_{23}$, $\Phi_{34}$, and $\Phi_{14}$). The right shift register 520 samples at the short pulses to generate non-overlapping clock phases ($\Phi_{23d}$ and $\Phi_{14d}$). The right shift register 520 also generates clock phase $\Phi_s$ to temporarily increase the comparator bias current.

Figure 6:
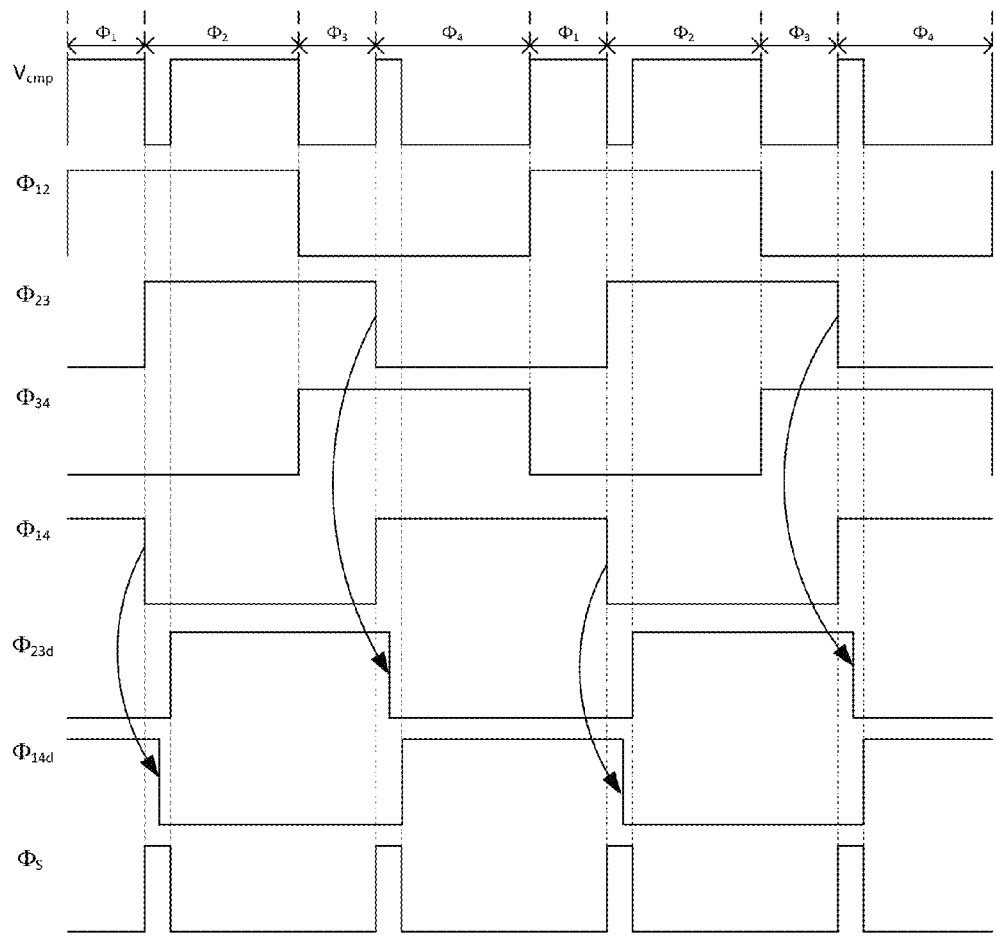
FIG. 6 shows the timing diagram of the clock phases generated by the clock generator.

FIG. 6 shows the timing diagram of the clock phases generated by the clock generator 140. As stated above, the comparator output ($V_{cmp}$) includes four basic phases ($\Phi_1$, $\Phi_2$, $\Phi_3$, and $\Phi_4$) in one clock cycle. Thus, the four phases ($\Phi_1$, $\Phi_2$, $\Phi_3$, and $\Phi_4$) and the control clocks ($\Phi_{12}$, $\Phi_{23}$, $\Phi_{34}$, and $\Phi_{14}$) derived from those basic phases are used to control the charging and discharging of the current sources in the cancellation circuit 110, and to control the switches in the chopper 120. During each phase of clock phases $\Phi_2$ and $\Phi_4$, there is a short pulse caused by the swapping of the comparator inputs in the chopper 120. This short pulse is used to generate non-overlapping phases $\Phi_{23d}$ and $\Phi_{14d}$. The non-overlapping phases are used in the chopper 120 to eliminate the charge sharing during the swapping of the comparator inputs. The clock generator 140 also generates clock phase $\Phi_s$ using the short pulse to temporarily increase the comparator bias current which reduces the pulse width.

Figure 7:
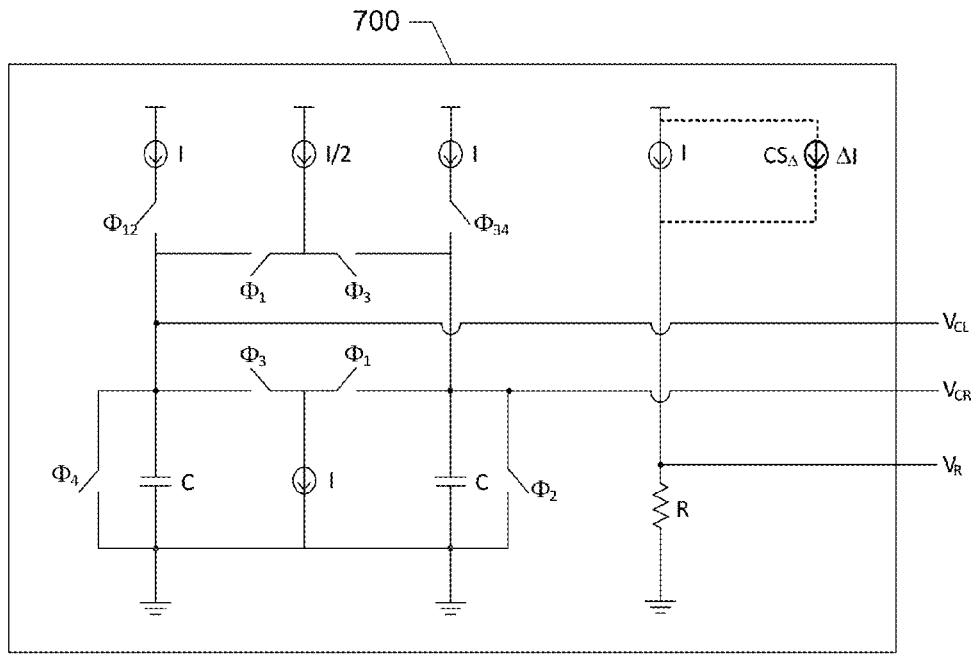
FIG. 7 is a detailed schematic diagram of a delay-cancellation circuit including the resistor compensation current source ($CS_A$) in accordance with one embodiment of the present invention.

After mitigating the temperature and voltage-dependence, the RC oscillator frequency is still dependent on process parameters. For example, the frequency of the RC oscillator can vary up to ±20% across corners, which is due to the resistance and capacitance variation at different corners. To remove or calibrate out the process variation in the oscillator design, a compensation current ($\Delta I$) can be added to the resistor by adding a compensation current source. FIG. 7 is a detailed schematic diagram of a delay-cancellation circuit 700 including the resistor compensation current source ($CS_A$) in accordance with one embodiment of the present invention. The delta increase or decrease of the compensation current corrects for the variation of the RC time constant as shown below in equation (7).

$$T=T_1+T_2=2(1+\Delta)*RC \quad (7)$$

Figure 8:
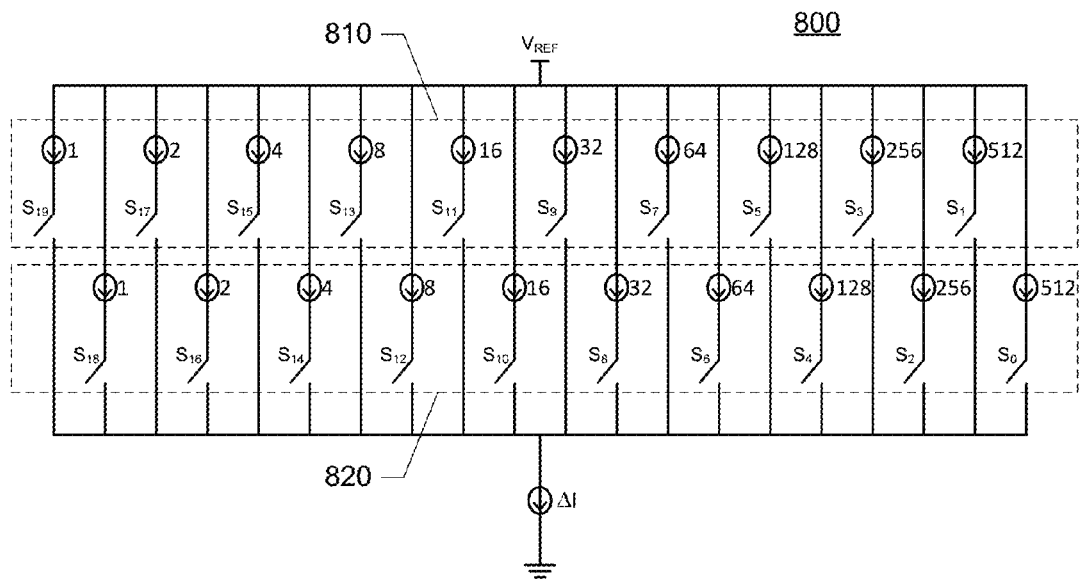
FIG. 8 is a schematic diagram of the compensation current source ($CS_A$) implemented with two sets of 10-bit switchable binary current digital-to-analog converters (DACs) in accordance with another embodiment of the present invention.

FIG. 8 is a schematic diagram of the compensation current source ($CS_A$) 800 implemented with two sets of 10-bit switchable binary current digital-to-analog converters (DACs) 810, 820 in accordance with another embodiment of the present invention. In one embodiment, the double binary currents are generated from a folded current mirror. The top 5 MSB DACs (32, 64, 128, 256, 512) use the first scaled-down gate bias voltage for higher current density, and the lower 5 LSB DACs (1, 2, 4, 8, 16) use the second scaled-down gate bias voltage for lower current density. Therefore, DACs are of the same or substantially similar transistor size.

In the illustrated embodiment of FIG. 8, the double binary current DACs are configured to compensate for the variations in the current mirror itself. Two coarse current DACs (IDACs) can be used to achieve high-resolution since any MSB DAC mismatch can be compensated for by the redundancy of the lower LSB DAC. Accordingly, no mismatch compensation or monotonicity is required for the double binary IDACs.

Figure 13:
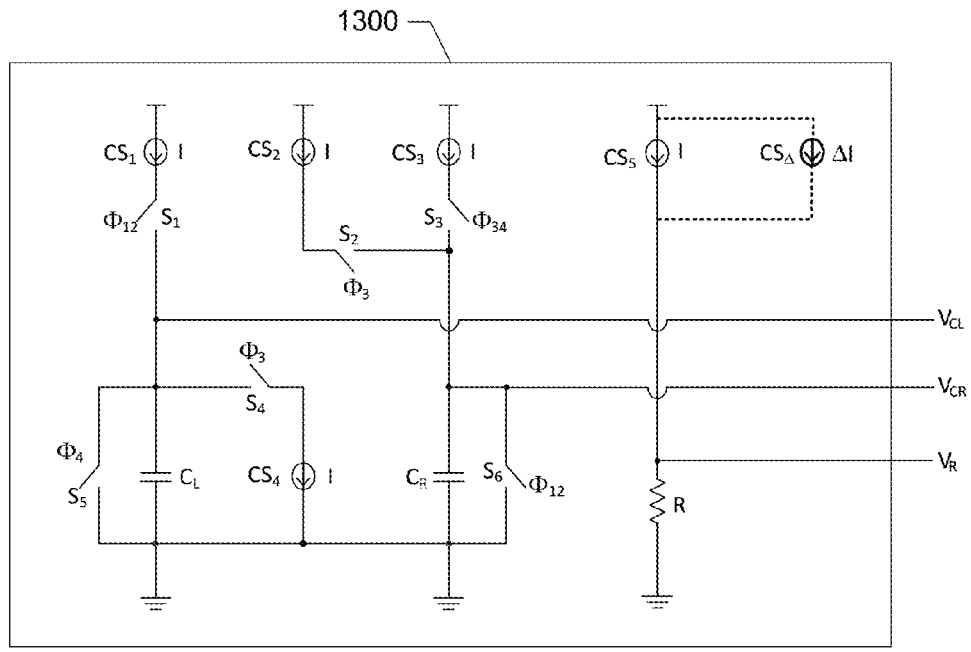
FIG. 13 is a detailed schematic diagram of a delay-cancellation circuit in accordance with another embodiment of the present invention.

FIG. 13 is a detailed schematic diagram of a delay-cancellation circuit 1300 in accordance with another embodiment of the present invention. In the illustrated embodiment of FIG. 13, the delay-cancellation circuit 1300 includes capacitors $C_L$ and $C_R$, resistor R, current sources $CS_1$ through $CS_5$, current sources $CS_A$, and switches $S_1$ through $S_6$. Current sources $CS_1$ through $CS_5$ supply current I, when connected, while current source $CS_A$ supply current $\Delta I$, when connected. Further, current sources $CS_1$, $CS_2$, $CS_3$, $CS_5$, and $CS_A$ are coupled to the supply voltage for charging the capacitors, while $CS_4$ is coupled to the ground voltage for discharging the capacitors. The delay-cancellation circuit 1300 also includes three output nodes, $V_{CL}$ (left capacitor voltage), $V_{CR}$ (right capacitor voltage), and $V_R$ (resistor voltage).

During the first and second clock phases ($\Phi_1$ and $\Phi_2$), switches $S_1$ and $S_6$ are closed so that capacitor $C_L$ is charged with current from current source $CS_1$, while capacitor $C_R$ is shorted to the ground. Thus, during these clock phases, capacitor $C_L$ is charged at a nominal rate because current source $CS_1$ supplies current I (nominal rate) to capacitor $C_L$. During the third clock phase ($\Phi_3$), switches $S_2$, $S_3$, and $S_4$ are closed so that capacitor $C_R$ is charged with current from current sources $CS_2$ and $CS_3$, while capacitor $C_L$ is discharged by current sink $CS_4$. Moreover, capacitor $C_R$ is charged at 100% higher rate (i.e., $C_R$ has double the ramp-up rate of $C_L$ during $\Phi_3$) than the nominal rate because current source $CS_3$ supplies current I (nominal rate), while current source $CS_2$ supplies additional current I (100% more) to capacitor $C_R$. During the fourth clock phase ($\Phi_4$), switches $S_3$ and $S_5$ are closed so that capacitor $C_R$ is charged with current from current source $CS_3$ only at a nominal rate, while capacitor $C_L$ is shorted to the ground. Current source $CS_5$ and $CS_A$ supply current $I+\Delta I$ to resistor R (similar to the delay-cancellation circuit configuration 700 including the resistor compensation current source ($CS_A$) shown in FIG. 7) so that the resistor voltage $V_R$ will have a constant value IR. Accordingly, $V_{CR}$ has two times faster ramp-up rate than $V_{CL}$ during $\Phi_3$, but $V_{CR}$ is reset at the beginning of every clock cycle (i.e., no ramp down but short to the ground with $S_6$). In contrasts, $V_{CL}$ ramps up at a nominal rate, but it is ramped down (with $CS_4$) for delay extraction.

Figure 14:
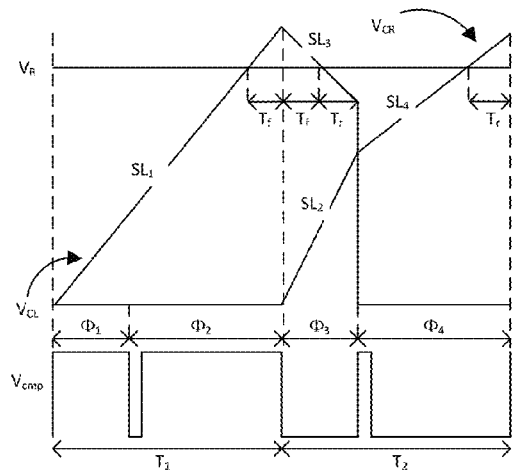
FIG. 14 is a diagram showing timing and voltage waveforms of the RC oscillator (as shown in FIG. 1) with delay cancellation circuit (as shown in FIG. 13).

FIG. 14 is a diagram showing timing and voltage waveforms of the RC oscillator 100 (as shown in FIG. 1) with delay cancellation circuit 1300 (as shown in FIG. 13). As described above with respect to FIG. 13, during the first and second clock phases ($\Phi_1$ and $\Phi_2$), capacitor $C_L$ is charged at a nominal rate by current source $CS_1$, while capacitor $C_R$ is reset by switch $S_6$. Correspondingly, during the first and second clock phases ($\Phi_1$ and $\Phi_2$) shown in FIG. 14, $V_{CL}$ ramps up at slope $SL_1$ at the nominal rate. Moreover, $V_{CR}$ is reset to the ground by switch $S_6$. During the third clock phase ($\Phi_3$) shown in FIG. 13, capacitor $C_R$ is charged at 100% higher rate than the nominal rate by current sources $CS_2$ and $CS_3$, while capacitor $C_L$ is discharged by current sink $CS_4$. Correspondingly, during the third clock phase ($\Phi_3$) shown in FIG. 14, $V_{CR}$ ramps up at slope $SL_2$ that is 100% higher than the nominal rate. Moreover, $V_{CL}$ ramps down (capacitor $C_L$ discharging) at the nominal rate (slope $SL_3$). Thus, after the comparator's output transitions, the capacitor voltage ($V_{CL}$) stays connected to the comparator, but it is ramped down at slope $SL_3$ with the same amount of discharging current. After some delay ($T_r$), it causes the comparator to make an opposite transition. The time duration between the two transitions is equal to the fall time delay ($T_f$) plus the rise time delay ($T_r$) of the comparator. During the fourth clock phase ($\Phi_4$) shown in FIG. 13, capacitor $C_R$ is charged by the current source $CS_3$, while capacitor $C_L$ is shorted to the ground by switch $S_5$. Correspondingly, during the fourth clock phase ($\Phi_4$) shown in FIG. 14, $V_{CR}$ ramps up at the nominal rate (slope $SL_4$). Moreover, $V_{CL}$ is reset to the ground voltage. Thus, the cancellation of the comparator delay from the clock period is shown in FIG. 14 with Equations (8), (9), and (10) showing the derivation of the clock period (T).

$$I*T_1C = I*R - V_{OS} + I*T_f/C \quad (8)$$

$$[I*T_2 + I*(T_f+T_r)]/C = I*R + V_{OS} + I*T_r/C \quad (9)$$

$$T = T_1 + T_2 = 2*RC \quad (10)$$

Equation (8) shows the comparator voltage during the first time period ($T_1$) including the first phase ($\Phi_1$) and the second phase ($\Phi_2$) of the clock pulse. Equation (9) shows the comparator voltage during the second time period ($T_2$) including the third phase ($\Phi_3$) and the fourth phase ($\Phi_4$) of the clock pulse. The difference in the comparator voltage during these two time periods is the opposite polarity of the offset voltage and the time delay, which cancel out to produce resultant equation (10). Thus, equation (10) shows that the clock period depends solely on the time constant (RC).

Figure 9:
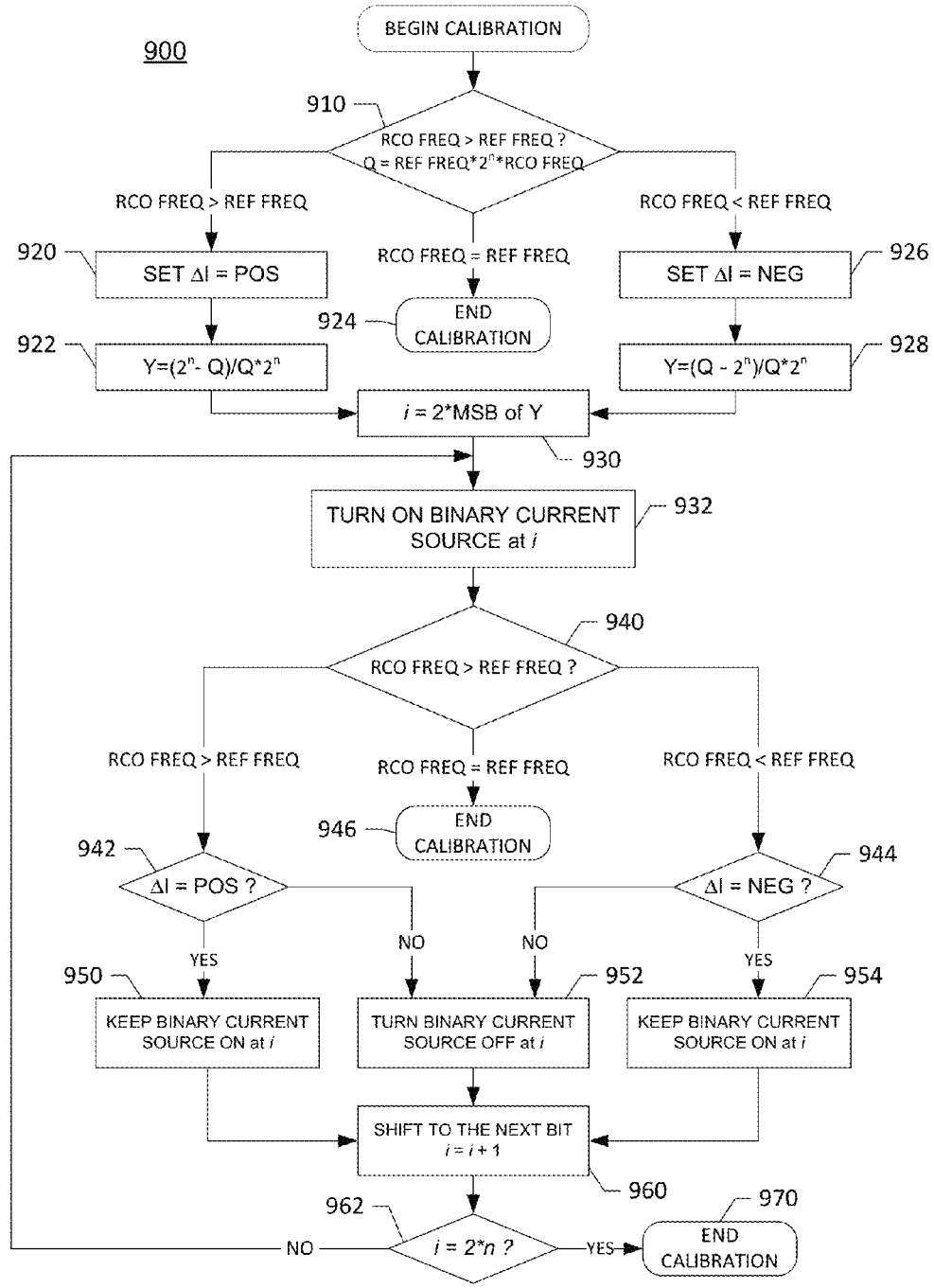
FIG. 9 is a flow diagram illustrating a method for calibrating the RC oscillator frequency in accordance with one embodiment of the present invention.

FIG. 9 is a flow diagram illustrating a method 900 for calibrating the RC oscillator frequency in accordance with one embodiment of the present invention. At the beginning of the calibration, the RC oscillator frequency is compared with a reference frequency, at step 910, to determine if the RC oscillator frequency is higher or lower than the reference frequency. The frequency comparison also generates (n+1)-bit code Q. For the 10-bit double binary current DACs shown in FIG. 8, the frequency comparison generates 11-bit code Q. From the frequency comparison, $$Q/(2RC) = f_{RCO}*2^n, \quad (11)$$

wherein RC is the time constant, $f_{RCO}$ is the RC oscillator frequency, and n is the number of bits in the compensation current source.

In one example in which n=10 and $f_{RCO}$=9.6 MHz, Q is equal to 9.6M*1024*2RC. In order to make the RC oscillator frequency equal to 9.6 MHz, the delta current can be derived as $1+\Delta = 1024/Q$. Since the LSB current has been scaled down by 1024, the normalized binary compensation current (Y) is given below in equations (12) and (13).

$$Y = (1024-Q)/Q*1024 \text{ (for } Q<1024) \quad (12)$$

$$Y = (Q-1024)/Q*1024 \text{ (for } Q>1024) \quad (13)$$

Although code Y is not directly used to control the compensation current mirror, it provides an index indicating where to start the calibration. For example, if Y=14, the calibration should start from the fourth LSB. In another example, if Y is 122, the calibration should start from the fourth MSB, and if Y is 277, the calibration should start from the second MSB. Therefore, once code Y is generated, it is then converted to a one-hot code. The hot position indicates the highest bit of code Y which is one. Accordingly, the one-hot code indicates to the controller where to start the calibration.

Once the RC oscillator frequency is compared to the reference frequency, at step 910, and it is determined that the oscillator frequency is greater than the reference frequency, $\Delta I$ is set to positive (POS), at step 920, and Y is calculated to be $(2^n-Q)/Q*2^n$, at step 922, where n is the resolution of the compensation current source. In the example of FIG. 8, n is equal to 10. Otherwise, if the oscillator frequency is less than the reference frequency, $\Delta I$ is set to negative (NEG), at step 926, and Y is calculated to be $(Q-2^n)/Q*2^n$, at step 928. Further, if the oscillator frequency is equal to the reference frequency, then the frequency calibration ends, at step 924. The current source index (i) is then set, at step 930, to MSB of Y.

During the calibration, the binary current source is turned on, at step 932, for bit i, and the new oscillator frequency is compared to the reference frequency, at step 940. Thus, the binary currents are turned on one at a time from MSB to LSB. If the frequency comparison keeps the same polarity, then the binary current source is kept on, and the calibration process jumps to the next current source. That is, if the new oscillator frequency is greater than the reference frequency and $\Delta I$ is equal to POS (i.e., the previous oscillator frequency was also greater than the reference frequency) to produce a YES answer, at step 942, then the binary current source at bit i is kept on, at step 950. However, if the new oscillator frequency is greater than the reference frequency and ΔI is equal to NEG (i.e., the previous oscillator frequency was less than the reference frequency) to produce a NO answer, at step 942, then the binary current source at bit i is turned off, at step 952. Otherwise, if the new oscillator frequency is less than the reference frequency and ΔI is equal to NEG (i.e., the previous oscillator frequency was also less than the reference frequency) to produce a YES answer, at step 944, then the binary current source at bit i is kept on, at step 954. However, if the new oscillator frequency is less than the reference frequency and ΔI is equal to POS (i.e., the previous oscillator frequency was greater than the reference frequency) to produce a NO answer, at step 944, then the binary current source at bit i is turned off, at step 952.

After step 950, 952, or 954, the index for the binary current source shifts to the next bit, at step 960. If it is determined, at step 962, that the incremented index for the binary current source is equal to 2*n, then the calibration ends, at step 970. Otherwise, if the incremented index for the binary current source has not yet reached 2*n, then the calibration resumes, at step 932, by turning the binary current source on at bit i on. Thus, during the calibration, a selected set of binary current sources is used to provide the correct amount of compensation current to adjust the RC oscillator frequency. After each calibration, a 2*n-bit calibration code is provided to the current mirror.

Figure 10:
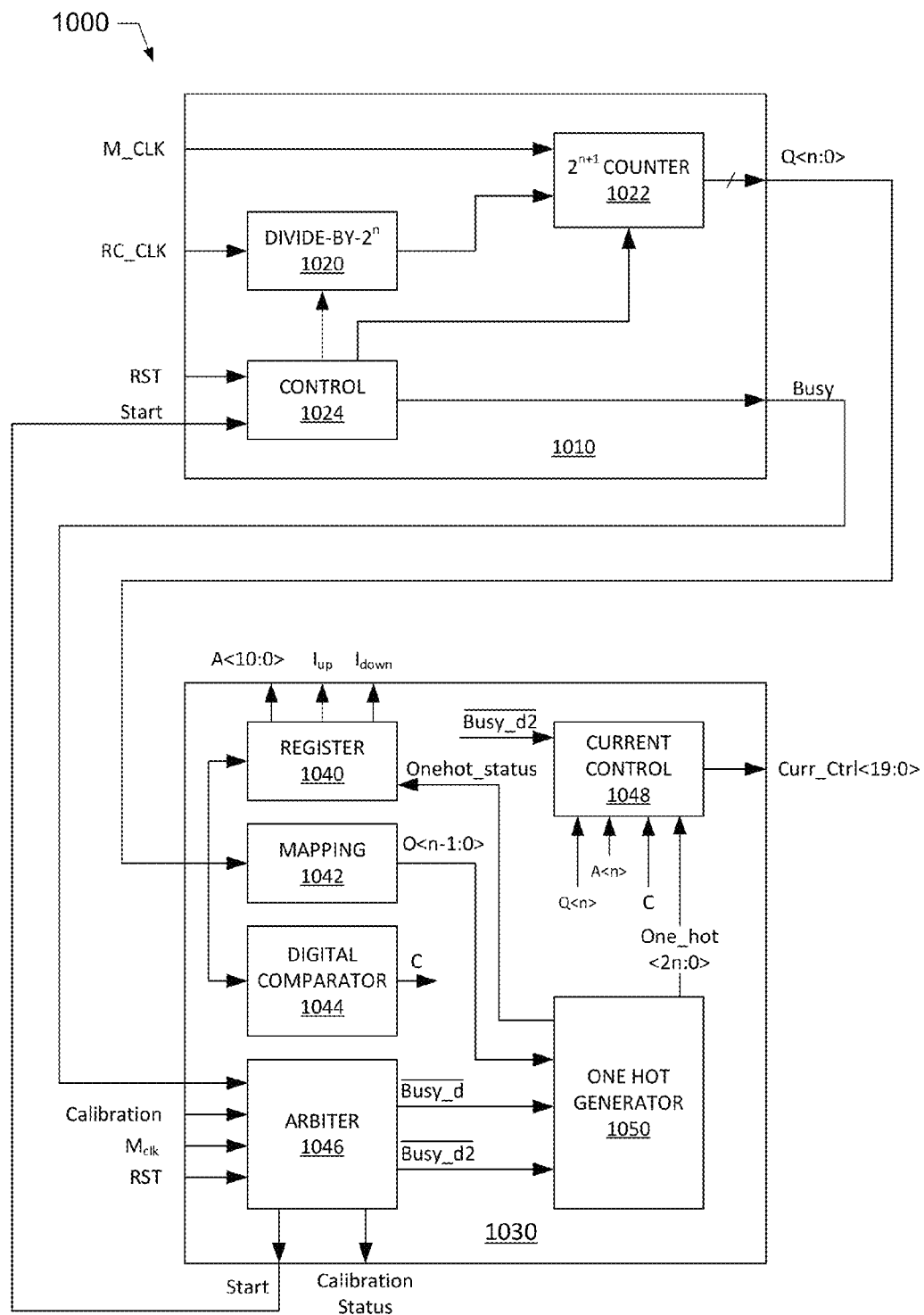
FIG. 10 is a calibration circuit configured to calibrate the RC oscillator frequency using compensation current source shown in FIG. 8 in accordance with one embodiment of the present invention.

FIG. 10 is a calibration circuit 1000 configured to calibrate the RC oscillator frequency using compensation current source shown in FIG. 8 in accordance with one embodiment of the present invention. In the illustrated embodiment of FIG. 10, the calibration circuit 1000 includes a frequency comparator 1010 and a controller 1030. The frequency comparator 1010 includes a divide-by-$2^n$ unit 1020, a $2^{n+1}$ counter 1022, and a control unit 1024. The controller 1030 includes a register 1040, a mapping unit 1042, a digital comparator 1044, an arbiter 1046, a current control unit 1048, and a one-hot generator 1050.

In the illustrated embodiment of FIG. 10, when Start signal is high, the control unit 1024 keeps the frequency comparator 1010 in a hold state for the input RC oscillator frequency to settle. The divide-by-$2^n$ unit 1020 then divides the RC oscillator clock (RC_CLK) for $2^n$ times (where n is the resolution of the compensation current source). This results in a time window equal to $2^n$ times RC oscillator clock cycles. During this time window, the $2^{n+1}$ counter 1022 counts the reference clock (M_CLK) to relate the RC oscillator frequency with the reference frequency and generate code Q. During the frequency comparison, the control unit 1024 keeps Busy signal high, while the signal is driven low once the comparison is done. Busy signal is transmitted to the arbiter unit 1046 of the controller 1030. The arbiter unit 1046 of the controller 1030 then reads code Q to determine the next step.

Figure 11:
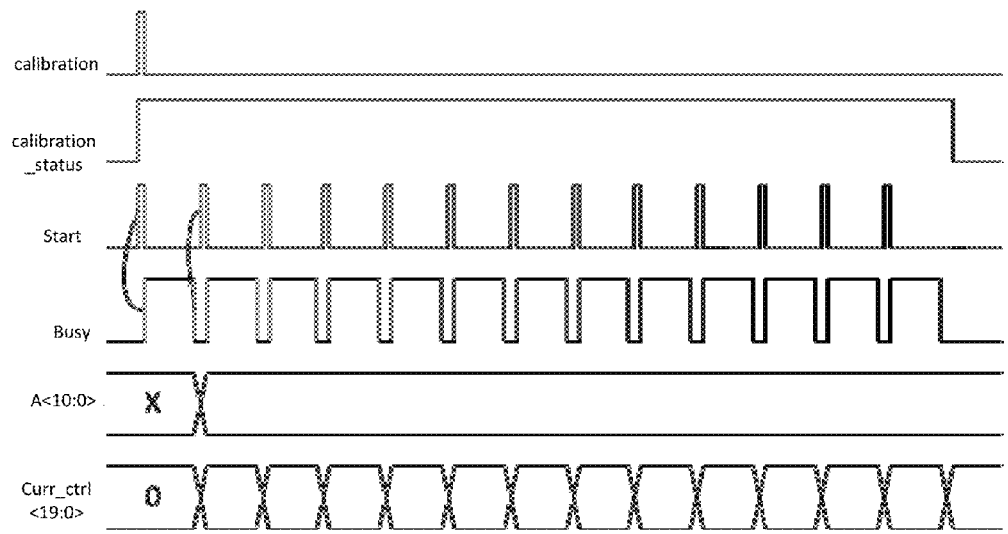
FIG. 11 is the timing diagram of the calibration method.
Figure 12:
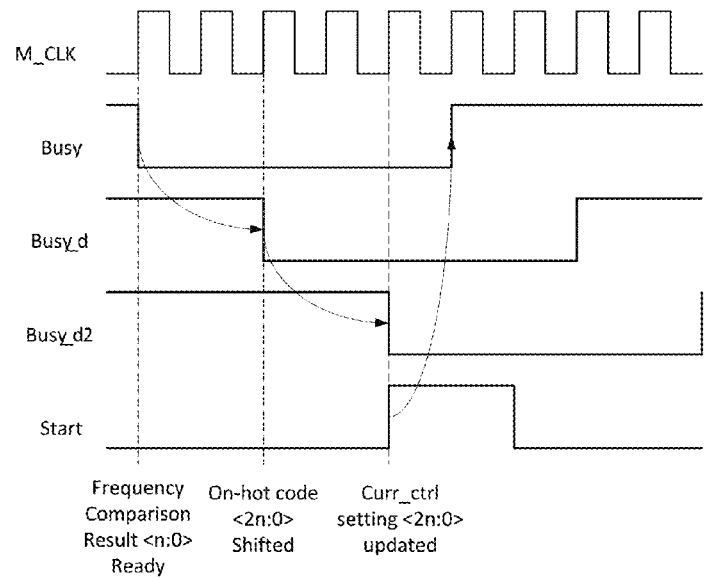
FIG. 12 shows the calibration timing signals.

In the controller 1030, the arbiter unit 1046 generates multiple timing control signals, which are sent to the D-flip-flops (DFF) in other sub-blocks. The one-hot generator 1050 generates (2n+1)-bit one-hot code, which indicates the current position or index of the double binary current sources under comparison. The current control unit 1048 includes 2n DFF pairs, which turns the current sources on or off. In the illustrated embodiment of the controller 1030 in FIG. 10, when calibration input is high, the arbiter unit 1046 of the controller 1030 generates Start signal which starts the frequency comparison. The first frequency comparison triggered by Start signal compares the nominal RC oscillator frequency with the reference frequency. Further, the comparison result determines the polarity of the calibration which either increases or decreases the resistor current. After the frequency comparison, Busy signal is driven low. In one embodiment, the arbiter unit 1046 uses the high-to-low transition of Busy signal to perform several operations between two frequency comparisons, and those operations need to be sequential since one operation uses the results of the other operation. Therefore, the arbiter unit 1046 delays Busy signal by two M_CLK cycles to generate Busy_d signal and delays Busy signal by four M_CLK cycles to generate Busy_d2 signal. Code Q is generated at the falling edge of Busy signal. The mapping block 1042 uses Busy signal to determine the starting index for the one-hot generator 1050, which shifts the one-hot bit at the falling edge of Busy_d signal. The output of the one-hot generator 1050 is then sent to the current control unit 1048, which uses the falling edge of Busy_d2 signal as the clock. At the beginning of the calibration, the one-hot state is all zero. After the first frequency comparison, the one-hot state transitions to a higher state at the falling edge of Busy_d2 signal. The one-hot status sent to the register 1040 indicates this transition. The low-to-high transition of the one-hot status signal clocks the register block, which saves the nominal RC oscillator frequency comparison results and the calibration polarity as described above. The digital comparator 1044 compares each frequency comparison results with value $2^n$. When the RC oscillator frequency reaches the target frequency, the calibration cycle ends. Otherwise, the calibration cycle transitions from the starting index to the last LSB. Start and Busy signals serve as hand-shaking signals between the frequency comparator 1010 and the controller 1030. FIG. 11 is the timing diagram of the calibration method and FIG. 12 shows the calibration timing signals.

Although several embodiments of the invention are described above, many variations of the invention are possible. For example, although the illustrated embodiments described above use two charging capacitors for the RC oscillator, more than two capacitors can be used. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A method for cancelling a delay in a comparator of an RC oscillator configured to generate a clock pulse, the method comprising:
    selectively coupling a plurality of current sources to a first capacitor, a second capacitor, and a resistor,
    wherein the plurality of current sources charge and discharge the first capacitor and the second capacitor, and charge the resistor;
    charging the first capacitor at a higher rate during a first phase of the clock pulse than a second phase of the clock pulse, and charging the second capacitor at a higher rate during a third phase of the clock pulse than a fourth phase of the clock pulse; and
    generating the clock pulse by enabling the comparator to compare a voltage on the first or second capacitor with a voltage on the resistor.

2. The method of claim 1, further comprising:
    selectively coupling the first or second capacitor alternately to a first input and a second input of the comparator; and
    coupling the resistor alternately to the second input and the first input of the comparator.

3. The method of 1, wherein the first capacitor is charged at 50% higher rate during the first phase and the second capacitor is charged at 50% higher rate during the third phase.

4. The method of claim 1, further comprising
    providing delta increase or decrease of a compensation current to the resistor using switchable binary current DACs.

5. The method of claim 4, further comprising
    calibrating frequency of the RC oscillator by turning on or off bits of the switchable binary current DACs.

6. The method of claim 5, wherein calibrating frequency of the RC oscillator includes
    comparing the frequency of the RC oscillator with a reference frequency.

7. The method of claim 6, further comprising
    generating a one-hot code indicating which bit of the switchable binary current DACs to start the calibration.

8. An RC oscillator which generates a clock pulse, the RC oscillator comprising:
    a comparator delay cancellation circuit comprising:
    a resistor and a pair of capacitors including a first capacitor and a second capacitor;
    a plurality of current sources configured to charge and discharge the pair of capacitors and the resistor,
    wherein the first capacitor is charged during first and second phases of the clock pulse and is discharged during third and fourth phases of the clock pulse, and the second capacitor is charged during the third and fourth phases of the clock pulse and is discharged during the first and second phases of the clock pulse,
    wherein the first capacitor is charged at a same rate during the first phase as the second phase, and the second capacitor is charged at a higher rate during the third phase than the fourth phase;
    a plurality of switches configured to selectively couple the plurality of current sources to the pair of capacitors and the resistor;
    a comparator having a first input and a second input, the comparator configured to generate the clock pulse by comparing a voltage on the first or second capacitor with a voltage on the resistor.

9. The RC oscillator of claim 8, further comprising
    a chopper configured to selectively couple the first or second capacitor alternately to the first input and the second input of the comparator, and couple the resistor alternately to the second input and the first input of the comparator.

10. The RC oscillator of claim 8, wherein each of the plurality of current sources supplies a fixed amount of current of equal value with an exception of a first current source which supplies one half of the fixed amount of current,
    wherein the plurality of switches is configured to couple the first current source and another current source to charge the first capacitor at approximately 50% higher rate during the first phase and to charge the second capacitor at approximately 50% higher rate during the third phase.

11. The RC oscillator of claim 8, further comprising
    a clock generator configured to receive the clock pulse from the comparator and to generate various clocks,
    wherein the various clocks are fed back to the comparator delay cancellation circuit and the chopper to control the plurality of switches.

12. The RC oscillator of claim 8, further comprising
    a resistor compensation current source configured to provide delta increase or decrease of a compensation current to the resistor.

13. The RC oscillator of claim 12, wherein the resistor compensation current source comprises two sets of switchable binary current digital-to-analog converters (DACs).

14. The RC oscillator of claim 13, further comprising
    a frequency calibration unit configured to calibrate an RC oscillator frequency by turning on or off bits of the switchable binary current DACs.

15. The RC oscillator of claim 14, wherein the frequency calibration unit comprises:
    a frequency comparator configured to compare the RC oscillator frequency with a reference frequency; and
    a controller.

16. The RC oscillator of claim 15, wherein the frequency comparator comprises:
    a divide-by-2n unit configured to divide the clock pulse for 2n times, where n is the number of bits in the current source;

a 2n+1 counter configured to count a reference clock to relate the RC oscillator frequency with the reference frequency and to generate code Q; and a control unit.

17. The RC oscillator of claim 15, wherein the controller comprises:

an arbiter configured to generate multiple timing control signals;

a one-hot generator configured to generate (2n+1)-bit one-hot code that indicates a current position of the switchable binary current DACs; and a current control unit configured to turn current sources of the switchable binary current DACs on or off.

18. An apparatus to generate a clock pulse, the apparatus comprising:

means for comparing two voltages having a first input and a second input;

means for canceling delay in the means for comparing two voltages comprising:

means for charging and discharging a first capacitor and a second capacitor, wherein the means for charging and discharging charges the first capacitor at a higher rate during a first phase of the clock than a second phase of the clock pulse, and charges the second capacitor at a higher rate during a third phase of the clock pulse than a fourth phase of the clock pulse;

means for selectively coupling the means for charging and discharging to the pair of capacitors and a resistor, wherein the means for comparing two voltages generates the clock pulse by comparing a voltage on the first or second capacitor with a voltage on the resistor.

19. The apparatus of claim 18, further comprising means for selectively coupling the first or second capacitor alternately to the first input and the second input, and coupling the resistor alternately to the second input and the first input.

20. The apparatus of claim 18, further comprising means for providing delta increase or decrease of a compensation current to the resistor.

\* \* \* \* \*